United States Patent
Cheng et al.

(10) Patent No.: US 9,722,125 B1
(45) Date of Patent: Aug. 1, 2017

(54) RADIATION SENSOR, METHOD OF FORMING THE SENSOR AND DEVICE INCLUDING THE SENSOR

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 24 days.

(21) Appl. No.: 15/198,426

(22) Filed: Jun. 30, 2016

(51) Int. Cl.
| | |
|---|---|
| *H01L 21/00* | (2006.01) |
| *H01L 31/119* | (2006.01) |
| *H01L 31/113* | (2006.01) |
| *H01L 31/0352* | (2006.01) |
| *H01L 29/08* | (2006.01) |
| *H01L 29/06* | (2006.01) |
| *H01L 27/144* | (2006.01) |
| *H01L 21/8234* | (2006.01) |
| *H01L 31/18* | (2006.01) |
| *H01L 29/78* | (2006.01) |
| *H01L 29/66* | (2006.01) |

(52) U.S. Cl.
CPC .... *H01L 31/119* (2013.01); *H01L 21/823418* (2013.01); *H01L 21/823487* (2013.01); *H01L 27/1443* (2013.01); *H01L 27/1446* (2013.01); *H01L 29/0657* (2013.01); *H01L 29/0847* (2013.01); *H01L 29/6656* (2013.01); *H01L 29/7827* (2013.01); *H01L 31/0352* (2013.01); *H01L 31/1136* (2013.01); *H01L 31/18* (2013.01)

(58) Field of Classification Search
CPC .............. H01L 31/119; H01L 31/1136; H01L 31/0352; H01L 31/18; H01L 29/0847; H01L 29/0657; H01L 29/7827; H01L 29/6656; H01L 21/823487; H01L 21/823418
See application file for complete search history.

(56) References Cited

U.S. PATENT DOCUMENTS

| | | | |
|---|---|---|---|
| 7,033,877 | B2 | 4/2006 | Chaudhry et al. |
| 7,732,816 | B2 | 6/2010 | Fazan et al. |
| 7,936,270 | B2 | 5/2011 | Britton, Jr. et al. |
| 7,940,381 | B2 | 5/2011 | Afzali-Ardakani et al. |
| 8,841,712 | B2 | 9/2014 | Rajagopal et al. |
| 8,872,154 | B2 | 10/2014 | Franklin et al. |
| 8,890,119 | B2 | 11/2014 | Doyle et al. |
| 9,170,288 | B2 | 10/2015 | O'Brien et al. |
| 9,217,673 | B2 | 12/2015 | Corcos et al. |

(Continued)

FOREIGN PATENT DOCUMENTS

| | | |
|---|---|---|
| JP | 2010-151540 A | 7/2010 |
| JP | 2012-063194 A | 3/2012 |
| JP | 5459554 B2 | 4/2014 |

*Primary Examiner* — Nicholas Tobergte
(74) *Attorney, Agent, or Firm* — Vazken Alexanian; McGinn IP Law Group, PLLC

(57) ABSTRACT

A radiation sensor includes a fin structure including semiconductor material formed on a substrate, a gate formed on an inner side of the fin structure, and a charge collector dielectric layer formed on an outer side of the fin structure.

25 Claims, 11 Drawing Sheets

(56) References Cited

U.S. PATENT DOCUMENTS

| | | |
|---|---|---|
| 9,243,277 B2 | 1/2016 | Rajagopal et al. |
| 9,293,560 B2 | 3/2016 | Doyle et al. |
| 2008/0176030 A1* | 7/2008 | Fonash .................. B82Y 20/00 428/119 |
| 2011/0023955 A1* | 2/2011 | Fonash .................. B82Y 20/00 136/256 |

* cited by examiner

US 9,722,125 B1

RADIATION SENSOR, METHOD OF FORMING THE SENSOR AND DEVICE INCLUDING THE SENSOR

BACKGROUND OF THE INVENTION

Field of the Invention

The present invention relates to a radiation sensor, and more particularly, to a radiation sensor which includes a fin structure and a charge collector dielectric layer formed on an outer side of the fin structure.

Description of the Related Art

Radiation sensors are conventionally used to sense the presence of electromagnetic radiation, such as gamma rays, X-rays and the higher energy range of ultraviolet light. They may measure radiation in terms of accumulated dose (e.g., rad) or in terms of dose rate (e.g., rads per unit time). They have many applications, including in medical and space technologies.

A metal oxide semiconductor field effect transistor (MOSFET) dosimeter is an example of a conventional radiation sensor. When a MOSFET dosimeter is irradiated, electron-hole pairs are generated within the gate oxide of the MOSFET by the incident radiation. Electrons quickly move out of the gate electrode of the MOSFET while holes move towards the silicon/gate oxide interface where they become trapped in long term sites, causing a negative threshold voltage shift which can persist for years. The difference in voltage shift before and after exposure can be measured, and is proportional to dose.

SUMMARY

In view of the foregoing and other problems, disadvantages, and drawbacks of the aforementioned conventional devices and methods, an exemplary aspect of the present invention is directed to a radiation sensor that may be formed by modifying a vertical field effect transistor (VFET).

An exemplary aspect of the present invention is directed to a radiation sensor includes a fin structure including semiconductor material formed on a substrate, a gate formed on an inner side of the fin structure, and a charge collector dielectric layer formed on an outer side of the fin structure.

Another exemplary aspect of the present invention is directed to a method of forming a radiation sensor. The method includes forming a plurality of vertical field effect transistors (VFETs) on a logic region and sensor region of a substrate, forming a mask on the logic region, so as to expose the sensor region, removing a gate from an outer side of a pair of fin structures of a VFET in the sensor region, and forming a charge collector dielectric layer on the outer side of the pair of fin structures.

Another exemplary aspect of the present invention is directed to a radiation sensor. The radiation sensor includes a first source/drain region formed on a substrate, a pair of fin structures including semiconductor material formed on the first source/drain region, a high-k dielectric layer formed on an inner side of the pair of fin structures, a metal gate formed on the high-k dielectric layer between the pair of fin structures, a charge collector dielectric layer formed on an outer side of the pair of fin structures, and a second source/drain region formed on an upper surface of the pair of fin structures.

With its unique and novel features, the present invention provides a radiation sensor that may be formed by modifying a vertical field effect transistor (VFET).

BRIEF DESCRIPTION OF THE DRAWINGS

The foregoing and other objects, aspects and advantages will be better understood from the following detailed description of the embodiments of the invention with reference to the drawings, in which.

DETAILED DESCRIPTION OF THE EXEMPLARY EMBODIMENTS OF THE INVENTION

Vertical transistors are being explored as a device option for further scaling of complementary metal oxide semiconductor (CMOS). However, conventional vertical transistors are not sensitive to radiation due to superior channel control by metal gates at both sides of fins.

Figure 1:
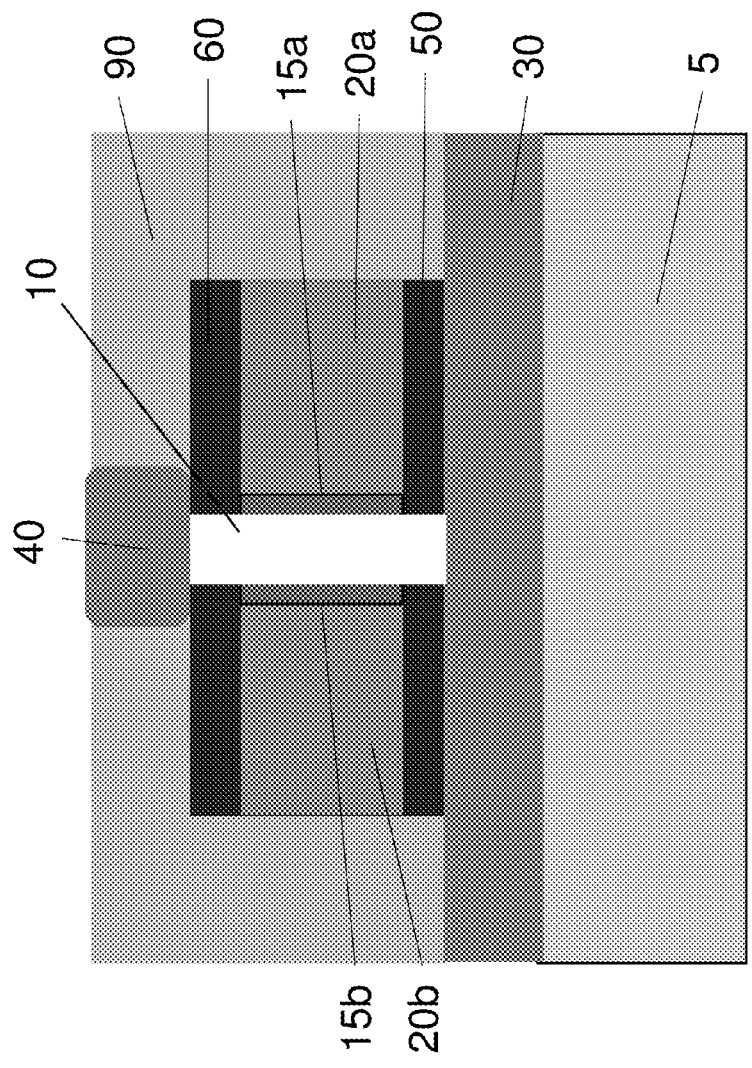
FIG. 1 illustrates a conventional vertical field effect transistor (VFET) 1.

FIG. 1 illustrates a conventional vertical field effect transistor (VFET) 1.

As illustrated in FIG. 1, the conventional VFET 1 has a fin structure 10 (e.g., fin channel) formed on a substrate 5, and metal gates 20$a$, 20$b$ formed on both sides of the fin structure 10 through the gate dielectric 15$a$, 15$b$.

The conventional VFET 1 also includes a source region 30 formed on the substrate 5, the fin structure 10 being formed on the source region 30, and a drain region 40 which is formed on the fin structure 10. A bottom spacer 50 is formed between the metal gates 20$a$, 20$b$ and the source region 30, and a top spacer 60 is formed between the drain region 40 and metal gates 20$a$, 20$b$. An interlayer dielectric 90 is formed on the metal gates 20$a$, 20$b$ and the source region 30.

In the conventional VFET 1, the fin structure 10 is well-controlled by both metal gates 20$a$, 20$b$. As a result, the conventional VFET 1 is not sensitive to radiation which is a very desirable quality for a VFET being used in microprocessors, but it precludes the VFET from being used in radiation sensors.

Referring now to the drawings, FIGS. 2A-7D illustrate the exemplary aspects of the present invention.

Figure 2A:
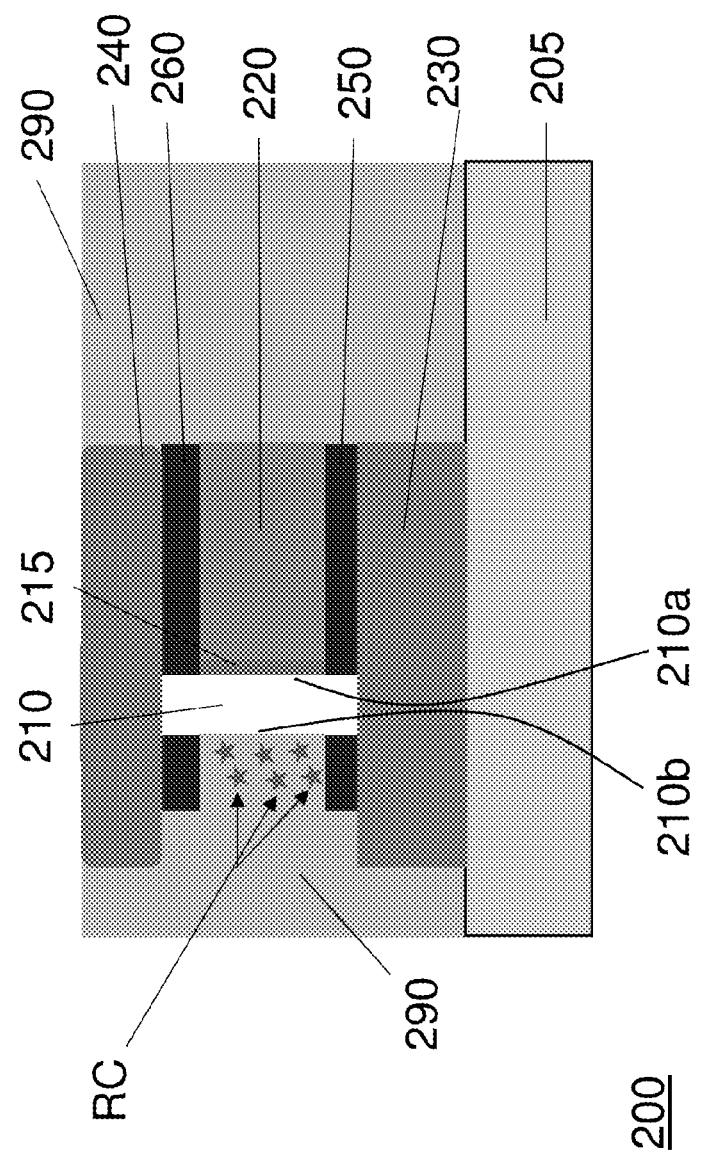
FIG. 2A illustrates a radiation sensor 200, according to an exemplary aspect of the present invention'

In particular, FIG. 2A illustrates a radiation sensor 200, according to an exemplary aspect of the present invention.

As illustrated in FIG. 2A, the radiation sensor 200 includes a fin structure 210 including semiconductor material formed on a substrate 205, a gate 220 formed on an inner side 210a of the fin structure 210, and a charge collector dielectric layer 290 formed on an outer side 210b of the fin structure 210. It should be noted that the dielectric material which forms the charge collector dielectric layer 290 may also be formed on other parts of the radiation sensor 200 (e.g., on substrate 205), and not just on the outer side 210b of the fin structure 210. Thus, for example, the charge collector dielectric layer 290 may also function as an interlayer dielectric. The fin structure 210, sometimes referred to as fin channel, may include any suitable semiconductor material, including but not limited to, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The radiation sensor 200 may also include a gate dielectric 215 formed between the gate 220 and the inner side 210a of the fin structure 210. The gate 220 may include a conductive material such as a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or doped polycrystalline or amorphous silicon, germanium, silicon germanium, or any suitable combination of these materials. The gate dielectric 215 may include an oxide such as silicon oxide, or a high-k dielectric material, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. The charge collector dielectric layer 290 may include a dielectric such as silicon oxide, silicon oxynitride, silicon nitride, SiCO, SiOCN, SiCOH, SiBCN, or any suitable combination of those materials.

The radiation sensor 200 may also include a first source/drain region 230 formed on the substrate 205, the fin structure 210 being formed on the first source/drain region 230. The radiation sensor 200 may also include a second source/drain region 240 formed on an upper surface of the fin structure 210. The source/drain region regions 230 and 240 can be doped with dopants such boron, gallium, indium, phosphorus, arsenic, antimony. The dopants can be incorporated in source/drain regions by any suitable doping technique, including but not limited to, ion implantation, gas phase doping, plasma doping, plasma immersion ion implantation, cluster doping, infusion doping, liquid phase doping, solid phase doping, in-situ doped epitaxy, or any suitable combination of those techniques.

The radiation sensor 200 may also include a bottom spacer 250 formed on the first source/drain region 230, the gate 220 being formed on the bottom spacer 250, and a top spacer 260 formed on the gate 220, the second source/drain region 240 being formed on the top spacer 260. The top and bottom spacers may a dielectric such as silicon oxide, silicon oxynitride, silicon nitride, SiCO, SiOCN, SiCOH, SiBCN, or any suitable combination of those materials.

As illustrated in FIG. 2A, the radiation sensor 200 may have a structure similar to the structure of a vertical field effect transistor (VFET) such as the conventional VFET 100 in FIG. 1. In an exemplary aspect of the present invention, the radiation sensor 200 may be formed by forming the VFET 100 and then modifying the VFET 100 to replace the gate 20b on one side of the fin structure 10 with the charge collector dielectric layer 290.

Thus, the radiation sensor 200 may be referred to as a VFET radiation sensor (e.g., a VFET with a one-sided gate), where a gate dielectric (e.g., high-k dielectric layer) and gate (e.g., metal gate) is formed only on one side of the fin structure. The other side of the fin structure is abutting the charge collector dielectric layer (e.g., oxide) which server as the collector of radiation charges.

As illustrated in FIG. 2A, when radiation (e.g., electromagnetic radiation, such as gamma rays, X-rays and the higher energy range of ultraviolet light) is incident on the charge collector dielectric layer 290, radiation charges RC (e.g., radiation particles) may become trapped in a portion of the charge collector dielectric layer 290 adjacent to the fin structure 210.

The portion of the charge collector dielectric layer 290 containing the radiation charges RC may thus serve as a back gate, modulating the transistor characteristics (e.g., the threshold voltage (Vt)) of radiation sensor 200. That is, for example, a threshold voltage Vt of the radiation sensor 200 may shift as a function of radiation dose (e.g., the amount of radiation to which the radiation sensor 200 is exposed, or the amount of radiation incident on the charge collector dielectric layer 290), and the gate 220 may be operable to sense the shifting of the threshold voltage (Vt) of the radiation sensor 200.

Figure 2B:
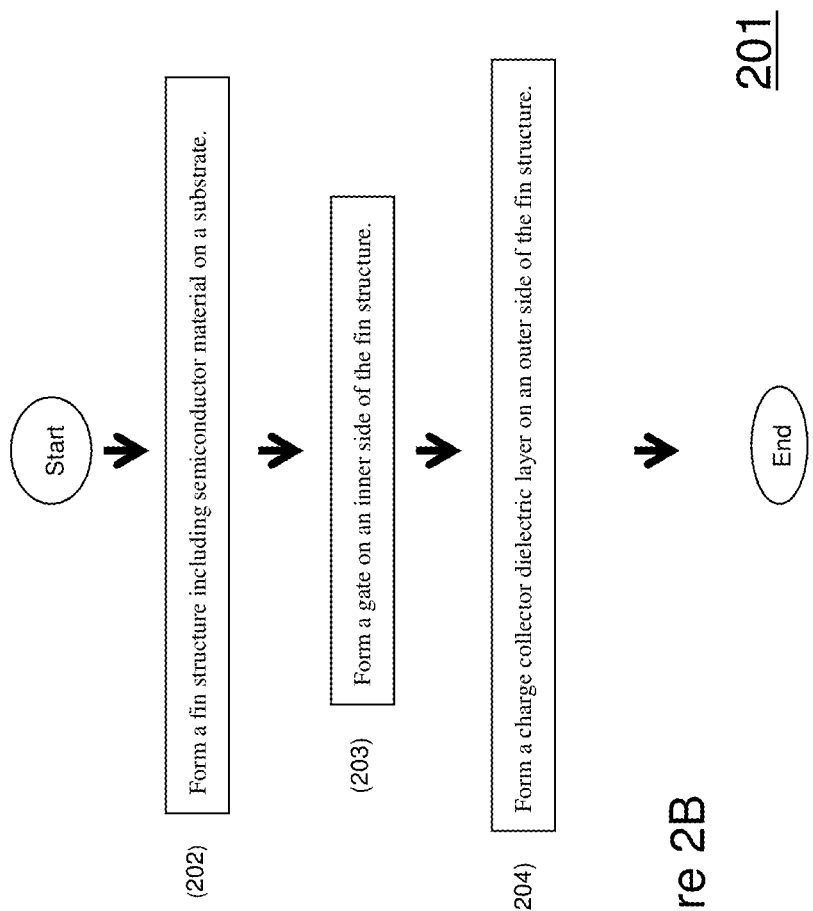
FIG. 2B illustrates a method 201 of forming a radiation sensor (e.g., radiation sensor 200), according to an exemplary aspect of the present invention.

FIG. 2B illustrates a method 201 of forming a radiation sensor (e.g., radiation sensor 200), according to an exemplary aspect of the present invention.

As illustrated in FIG. 2B, the method 201 includes forming (202) a fin structure including semiconductor material on a substrate, forming (203) a gate on an inner side of the fin structure, and forming (204) a charge collector dielectric layer on an outer side of the fin structure. In particular, the forming of the gate may include forming the gate on both the inner and outer sides of the fin structure, in which case, the forming of the charge collector dielectric layer may include removing the gate from the outer side of the fin structure, and then forming the charge collector dielectric layer.

Figure 3:
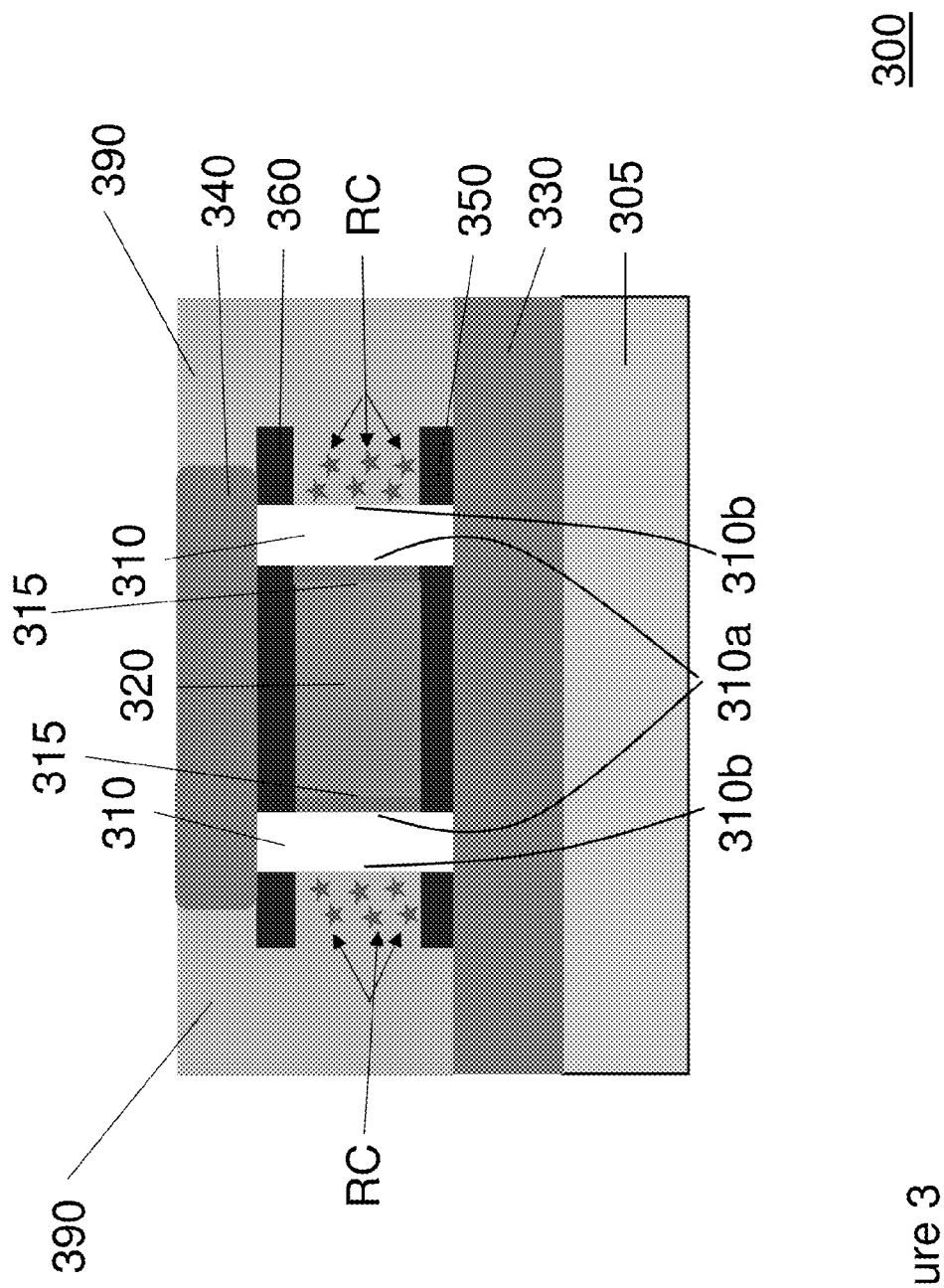
FIG. 3 illustrates a radiation sensor 300 according to an exemplary aspect of the present invention.

FIG. 3 illustrates a radiation sensor 300 according to an exemplary aspect of the present invention.

As illustrated in FIG. 3, the radiation sensor 300 is similar in structure to the radiation sensor 200, but includes a pair of fin structures 310 including semiconductor material formed on a substrate 305. The radiation sensor 300 also includes a gate 320 formed on an inner side 310a of the pair of fin structures 310, and a charge collector dielectric layer 390 formed on an outer side 310b of the pair of fin structures 310.

The radiation sensor 300 may also include a gate dielectric 315 formed between the gate 320 and the inner side 310a of the pair of fin structures 310. The gate 320 may include a conductive material such as a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or doped polycrystalline or amorphous silicon, germanium, silicon germanium, or any suitable combination of these materials. The gate dielectric 315 may include an oxide such as silicon oxide, or a high-k dielectric material, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. The charge collector dielectric layer 390 may include a dielectric such as silicon oxide, silicon oxynitride, silicon nitride, SiCO, SiOCN, SiCOH, SiBCN, or any suitable combination of those materials.

The radiation sensor 300 may also include a first source/drain region 330 formed on the substrate 305, the pair of fin structures 310 being formed on the first source/drain region 330. The radiation sensor 300 may also include a second source/drain region 340 formed on an upper surface of the pair of fin structures 310.

The radiation sensor 300 may also include a bottom spacer 350 formed on the first source/drain region 330, the gate 320 being formed on the bottom spacer 350, and a top spacer 360 formed on the gate 320, the second source/drain region 340 being formed on the top spacer 360.

As illustrated in FIG. 3, when radiation (e.g., electromagnetic radiation, such as gamma rays, X-rays and the higher energy range of ultraviolet light) is incident on the charge collector dielectric layer 390, radiation charges RC (e.g., radiation particles) may become trapped in a portion of the charge collector dielectric layer 390 adjacent to the pair of fin structures 310.

The portion of the charge collector dielectric layer 390 containing the radiation charges RC may thus serve as a back gate, modulating the transistor characteristics (e.g., the threshold voltage (Vt)) of radiation sensor 300. That is, for example, a threshold voltage Vt of the radiation sensor 300 may shift as a function of radiation dose (e.g., the amount of radiation to which the radiation sensor 300 is exposed, or the amount of radiation incident on the charge collector dielectric layer 390), and the gate 320 may be operable to sense the shifting of the threshold voltage (Vt) of the radiation sensor 300.

Figure 4:
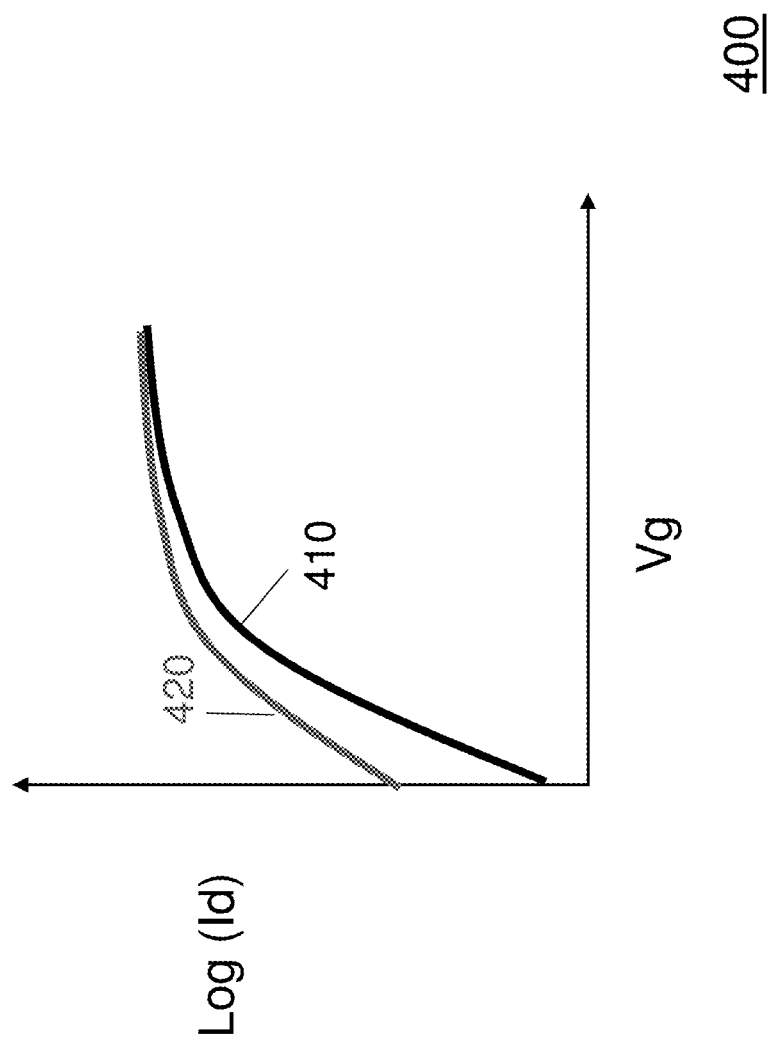
FIG. 4 provides a graph 400 illustrating a property (e.g., characteristic) of the radiation sensors 200, 300, according to an exemplary aspect of the present invention.

FIG. 4 provides a graph 400 illustrating a property (e.g., characteristic) of the radiation sensors 200, 300, according to an exemplary aspect of the present invention.

In the graph 400, the abscissa represents the gate voltage (Vg) of the radiation sensor 200, 300, and the ordinate represents the logarithm of the drain current (Id). Further, the line 410 indicates the properties of the radiation sensor 200, 300 before the radiation sensor 200, 300 is exposed to radiation, and the line 420 indicates the properties of the radiation sensor 200, 300 after the radiation sensor 200, 300 is exposed to radiation.

As illustrated in FIG. 4, the logarithm of the drain current (Id) is generally greater after the radiation sensor 200, 300 is exposed to radiation (e.g., line 420) than before the radiation sensor 200, 300 is exposed to radiation (e.g., line 410).

Another exemplary aspect of the present invention is directed to a semiconductor device including a radiation sensor (e.g., a plurality of radiation sensors) and a VFET (e.g., a plurality of VFETs) formed on the same substrate (e.g., the same semiconductor chip).

Figure 5:
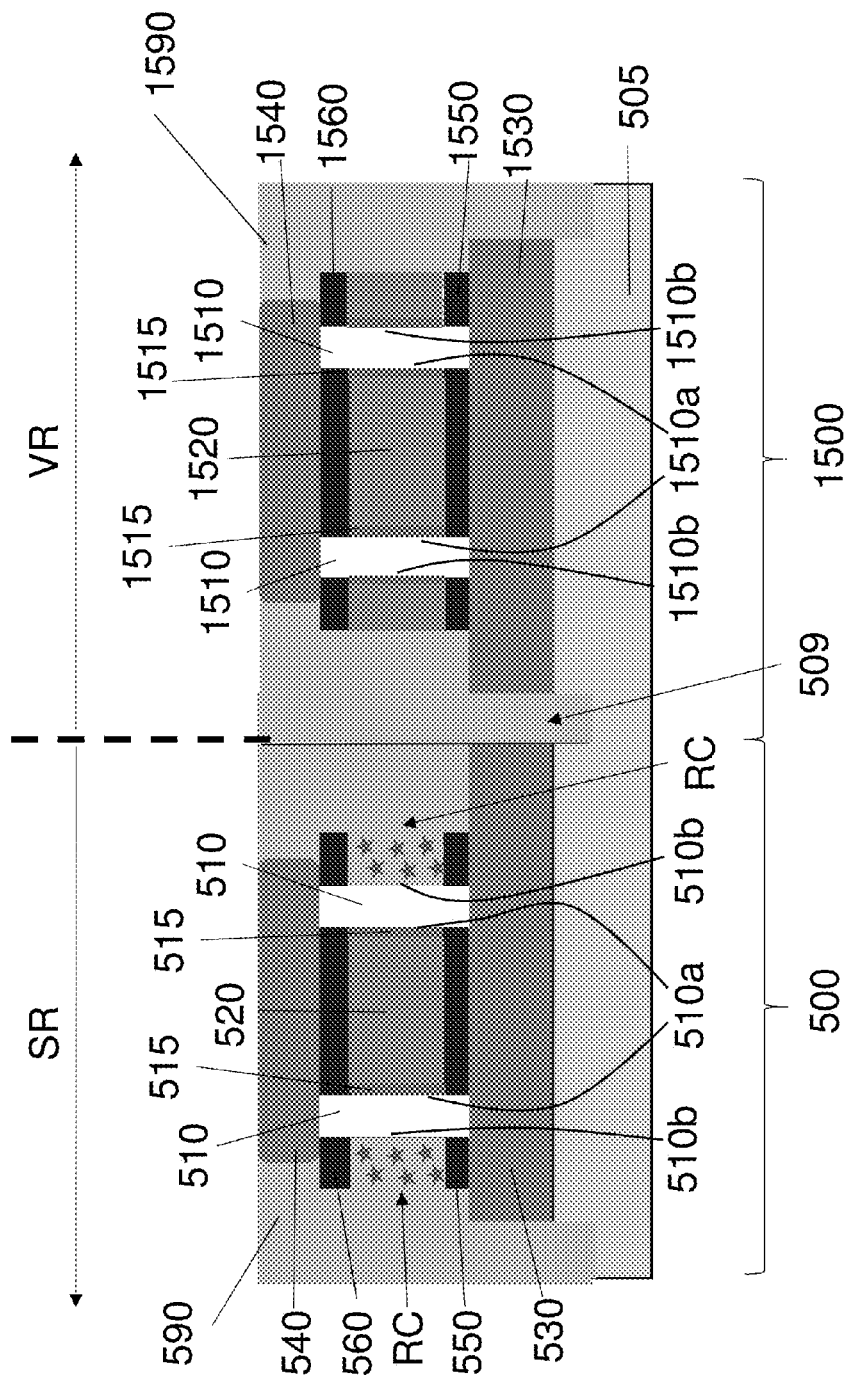
FIG. 5 illustrates a semiconductor device 501, according to an exemplary aspect of the present invention.

Referring again to the drawings, FIG. 5 illustrates a semiconductor device 501, according to an exemplary aspect of the present invention.

As illustrated in FIG. 5, the semiconductor device 501 includes a substrate 505 including a sensor region SR, and a VFET region VR formed adjacent to the sensor region SR. The sensor region SR of the semiconductor device 501 includes a radiation sensor 500 (e.g., plurality of radiation sensors 500) which may be similar in structure and function to the radiation sensor 300, and the VFET region VR includes a VFET 1500 (e.g., a plurality of VFETs 1500) formed on the same semiconductor chip (e.g., substrate 505).

The radiation sensor 500 includes a pair of fin structures 510 including semiconductor material formed on a substrate 505. The radiation sensor 500 also includes a gate 520 formed on an inner side 510a of the pair of fin structures 510, and a charge collector dielectric layer 590 formed on an outer side 510b of the pair of fin structures 510.

The radiation sensor 500 may also include a gate dielectric 515 formed between the gate 520 and the inner side 510a of the fin structures 510. The gate 520 may include a conductive material such as a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or doped polycrystalline or amorphous silicon, germanium, silicon germanium, or any suitable combination of these materials. The gate dielectric 515 may include an oxide such as silicon oxide, or a high-k dielectric material, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. The charge collector dielectric layer 590 may include a dielectric such as silicon oxide, silicon oxynitride, silicon nitride, SiCO, SiOCN, SiCOH, SiBCN, or any suitable combination of those materials.

The radiation sensor 500 may also include a first source/drain region 530 formed on the substrate 505, the fin structure 510 being formed on the first source/drain region 530. The radiation sensor 500 may also include a second source/drain region 540 formed on an upper surface of the fin structure 510.

The radiation sensor 500 may also include a bottom spacer 550 formed on the first source/drain region 530, the gate 520 being formed on the bottom spacer 550, and a top spacer 560 formed on the gate 520, the second source/drain region 540 being formed on the top spacer 560.

The VFET 1500 also includes a pair of fin structures 1510 including semiconductor material formed on a substrate 505, and a gate 1520 formed on an inner side 1510a of the pair of fin structures 1510 and on an outer side 1510b of the pair of fin structures 1510. The VFET 1500 also includes an interlayer dielectric 1590 formed on the gate 1520 (e.g., on the substrate 505).

The VFET 1500 may also include a gate dielectric 1515 formed between the gate 1520 and the inner side 1510a of the fin structures 1510 and on the outer side 1510b of the fin structures 1510, a first source/drain region 1530 formed on the substrate 1505, the fin structures 1510 being formed on the first source/drain region 1530, a second source/drain region 1540 formed on an upper surface of the fin structures 1510, a bottom spacer 1550 formed on the first source/drain region 1530, the gate 1520 being formed on the bottom spacer 1550, and a top spacer 1560 formed on the gate 1520, the second source/drain region 1540 being formed on the top spacer 1560.

As illustrated in FIG. 5, the semiconductor device 501 may also include an isolation region 509 (e.g., shallow trench oxide (STI)) which is formed in the substrate 505 between the radiation sensor 500 and the VFET 1500. As further illustrated in FIG. 9, the isolation region 509 may include, for example, a portion of the charge collector dielectric layer 590 or the interlayer dielectric 1590.

Another exemplary aspect of the present invention may provide a method of forming a semiconductor device including both radiation sensors and VFETs, using substantially the same processing steps. In this exemplary aspect, the radiation sensor may retain the basic vertical transistor structure, but a gate on one side of fins is replaced with oxide to collect radiation particles.

As illustrated in FIG. 5, when radiation (e.g., electromagnetic radiation, such as gamma rays, X-rays and the higher energy range of ultraviolet light) is incident on the charge collector dielectric layer 590, radiation charges RC (e.g., radiation particles) may become trapped in a portion of the charge collector dielectric layer 590 adjacent to the pair of fin structures 510.

The portion of the charge collector dielectric layer 590 containing the radiation charges RC may thus serve as a back gate, modulating the transistor characteristics (e.g., the threshold voltage (Vt)) of radiation sensor 500. That is, for example, a threshold voltage Vt of the radiation sensor 500 may shift as a function of radiation dose (e.g., the amount of radiation to which the radiation sensor 500 is exposed, or the amount of radiation incident on the charge collector dielectric layer 590), and the gate 520 may be operable to sense the shifting of the threshold voltage (Vt) of the radiation sensor 500.

Figure 6:
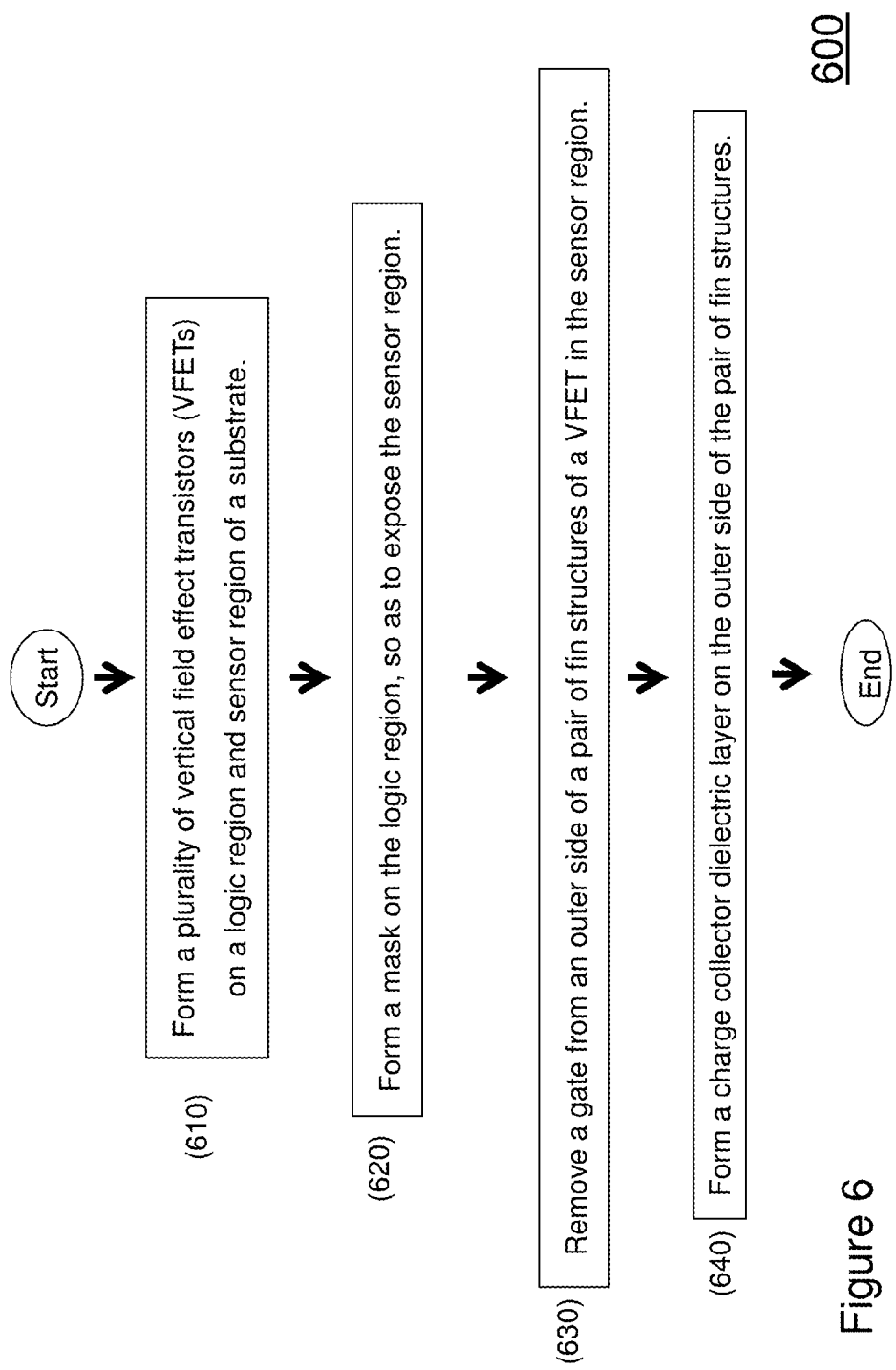
FIG. 6 illustrates a method 600 of forming a radiation sensor according to an exemplary aspect of the present invention.

FIG. 6 illustrates a method 600 of forming a radiation sensor according to an exemplary aspect of the present invention.

As illustrated in FIG. 6, the method 600 includes forming (610) a plurality of vertical field effect transistors (VFETs) on a logic region and sensor region of a substrate, forming (620) a mask on the logic region, so as to expose the sensor region, removing (630) a gate from an outer side of a pair of fin structures of a VFET in the sensor region, and forming (640) a charge collector dielectric layer on the outer side of the pair of fin structures.

It is noted that the term "logic region" as used herein, should be understood to mean any region outside of the sensor region and different from the sensor region. The "logic region" includes transistors with double-gated VFETs which can be used for a variety of applications such as logic, memory, anology, input-output, etc.

In an exemplary aspect of the present invention, the method 600 may include modifying the plurality of VFETs in the sensor region to form a plurality of radiation sensors in the sensor region, the modifying of the plurality of VFETs including the forming of the mask, the removing of the gate and the forming of the charge collector dielectric layer.

FIGS. 7A-7D illustrate a method 701 of forming a radiation sensor, according to another exemplary aspect of the present invention.

Figure 7A:
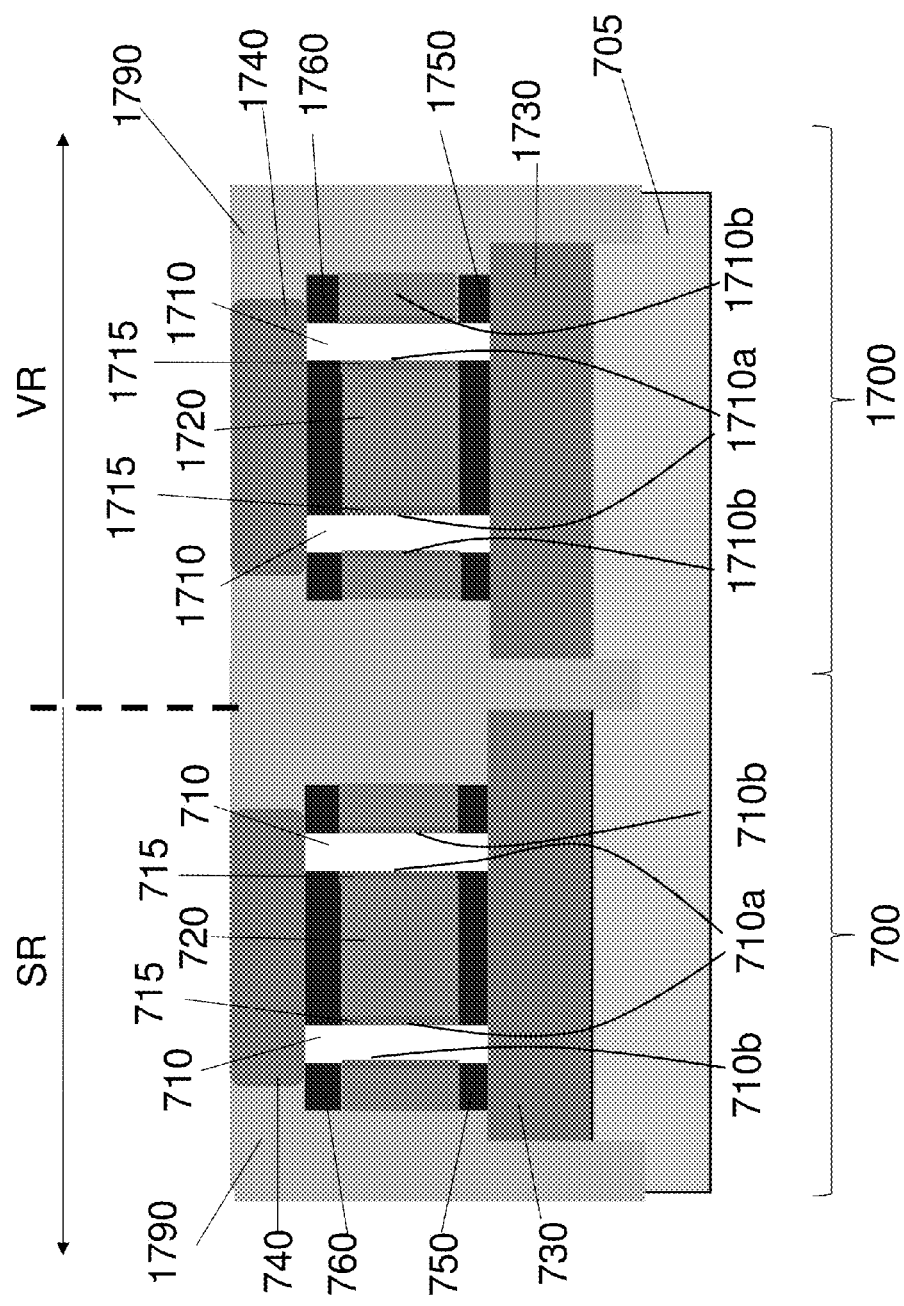
FIG. 7A illustrates a forming of a plurality of VFETs 700, 1700, according to an exemplary aspect of the present invention.

In particular, FIG. 7A illustrates a forming of a plurality of VFETs 700, 1700, according to an exemplary aspect of the present invention.

As illustrated in FIG. 7A, the method 701 may include forming a plurality of VFETs 700, 1700 on a substrate 705. For example, the forming of the plurality of VFETs 700, 1700 may include forming a first source/drain region 730, 1730 on a substrate 705, forming a pair of fin structures 710, 1710 including semiconductor material on the first source/drain region 730, 1730, respectively, forming a gate dielectric 715, 1715 on an inner side 710a, 1710a of the pair of fin structures 710, 1710, and on the outer side 710b, 1710b of the pair of fin structures 710, 1710 (e.g., wrapping the gate dielectric 715, 1715 around the pair of fin structures 710, 1710), forming a gate 720, 1720 on the gate dielectric 715, 1715 on the inner side of the pair of fin structures 710, 1710, and on the outer side of the pair of fin structures 710, 1710, and forming a second source/drain region 740, 1740 on an upper surface of the pair of fin structures 710, 1710.

Further, a bottom spacer 750, 1750 may be formed on the first source/drain region 730, 1730, the gate 720, 1720 being formed on the bottom spacer 750, 1750, and a top spacer 760, 1760 formed on the gate 720, 1720, the second source/drain region 740, 1740 being formed on the top spacer 760, 1760. An interlayer dielectric 1790 is formed on both the VFETs 700, 1700 (e.g., covers both the VFETs 700, 1700).

Thus, for example, the plurality of VFETs 700, 1700 (double-gated and insensitive to radiation) may be formed by a standard VFET formation flow process, so that a structure of the VFET 700 is substantially similar to the structure of the VFET 1700. In particular, each of the VFETs 700, 1700 may include a pair of fin structures 710, 1710 with a merged first source/drain region 730, 1730 beneath the pair of fin structures 710, 1710, and a merged second source/drain region 740, 1740 on top of the pair of fin structures 710, 1710.

Figure 7B:
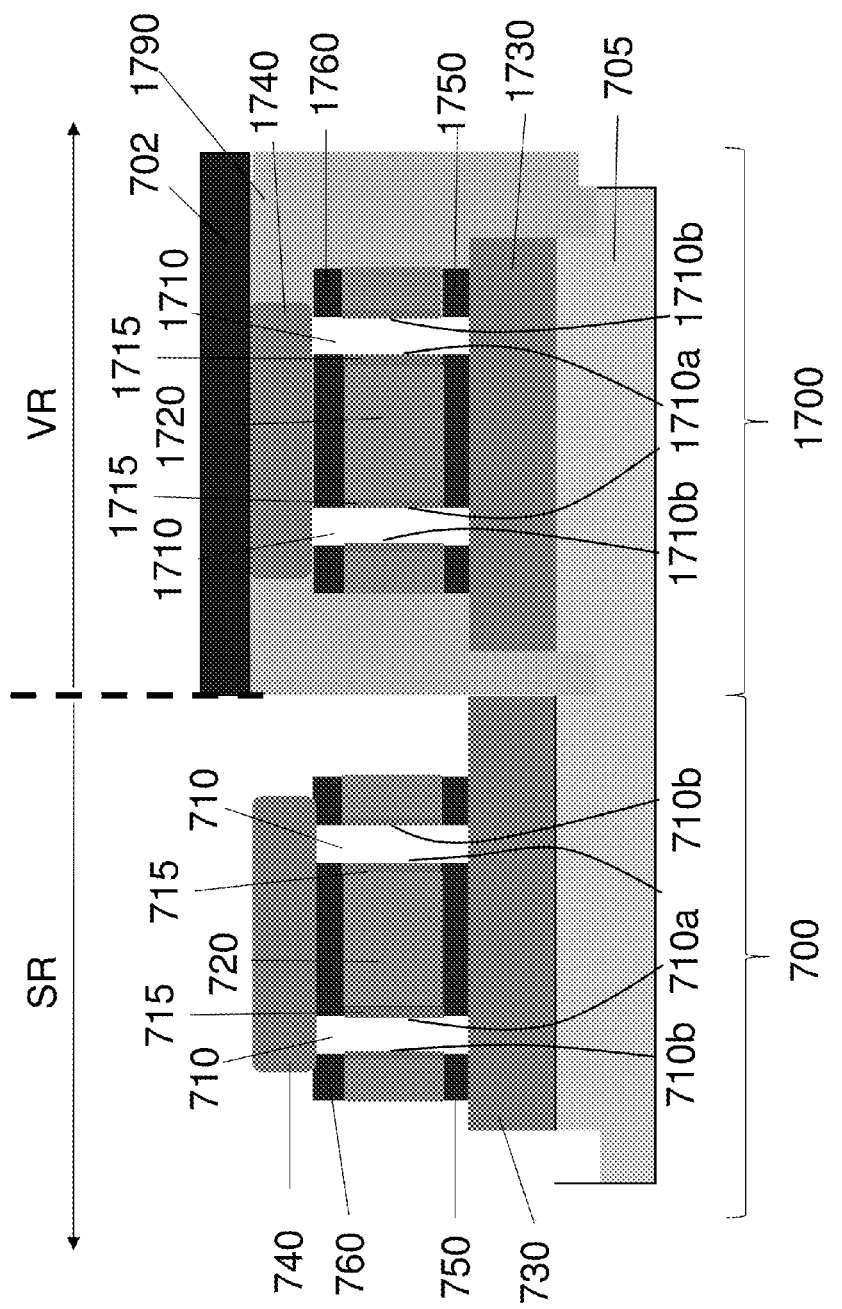
FIG. 7B illustrates an etching of the VFET 700, according to an exemplary aspect of the present invention.

FIG. 7B illustrates an etching of the VFET 700, according to an exemplary aspect of the present invention. As illustrated in FIG. 7B, a mask 702 (e.g., a hardmask such as silicon nitride) is formed on the VFET 1700 (e.g., VFET region of the substrate 705), so that the VFET 700 (e.g., sensor region of the substrate 705) is exposed. Then, the interlayer dielectric 1790 on the VFET 700 is etched by using the mask 702 so as to expose the gate 720 on the outer side 710b of the pair of fin structures 710.

Figure 7C:
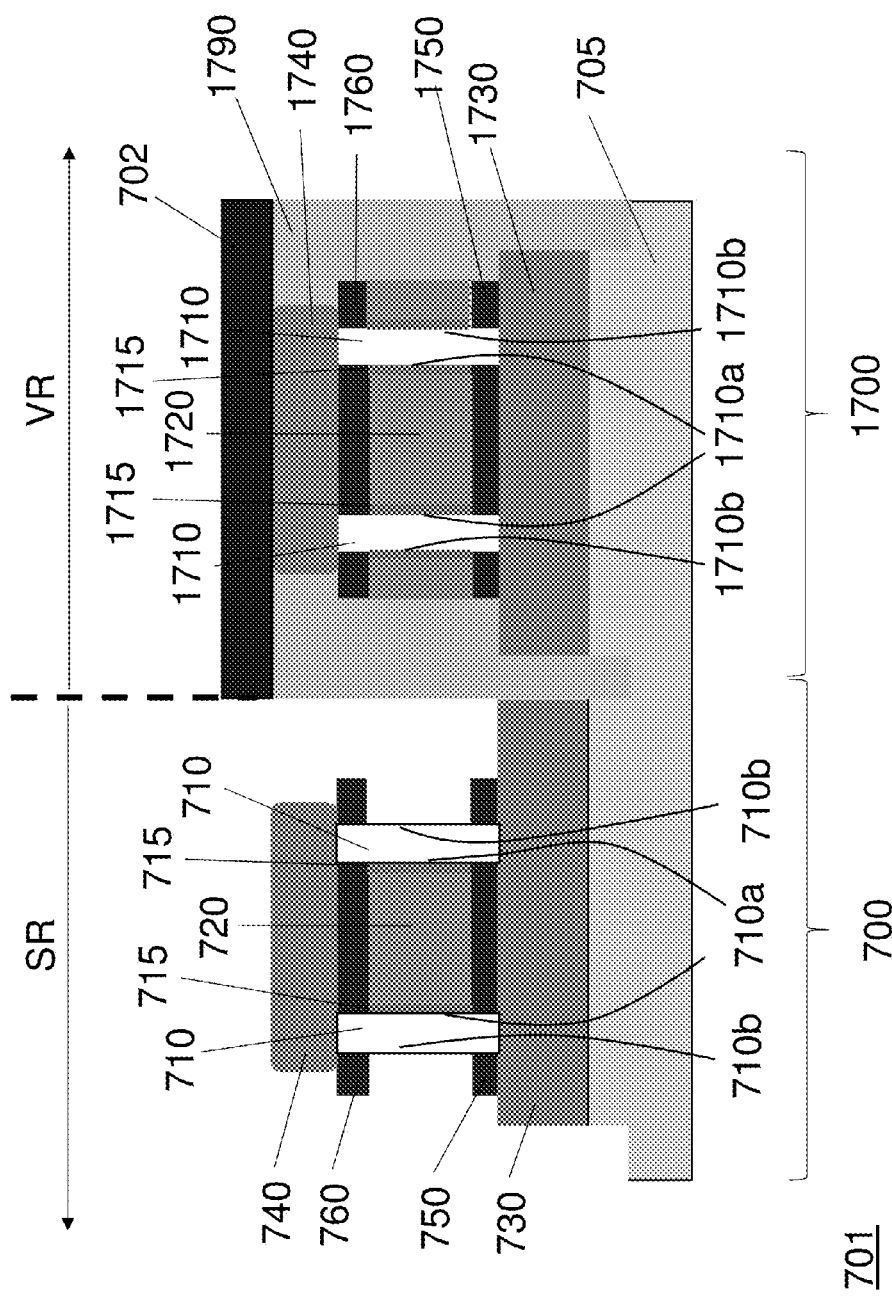
FIG. 7C illustrates another etching of the VFET 700, according to an exemplary aspect of the present invention.

FIG. 7C illustrates another etching of the VFET 700, according to an exemplary aspect of the present invention. As illustrated in FIG. 7C, the gate 720 and the gate dielectric 715 on the outer side 710b of the pair of fin structures 710 are removed by etching, by using the mask 702.

Figure 7D:
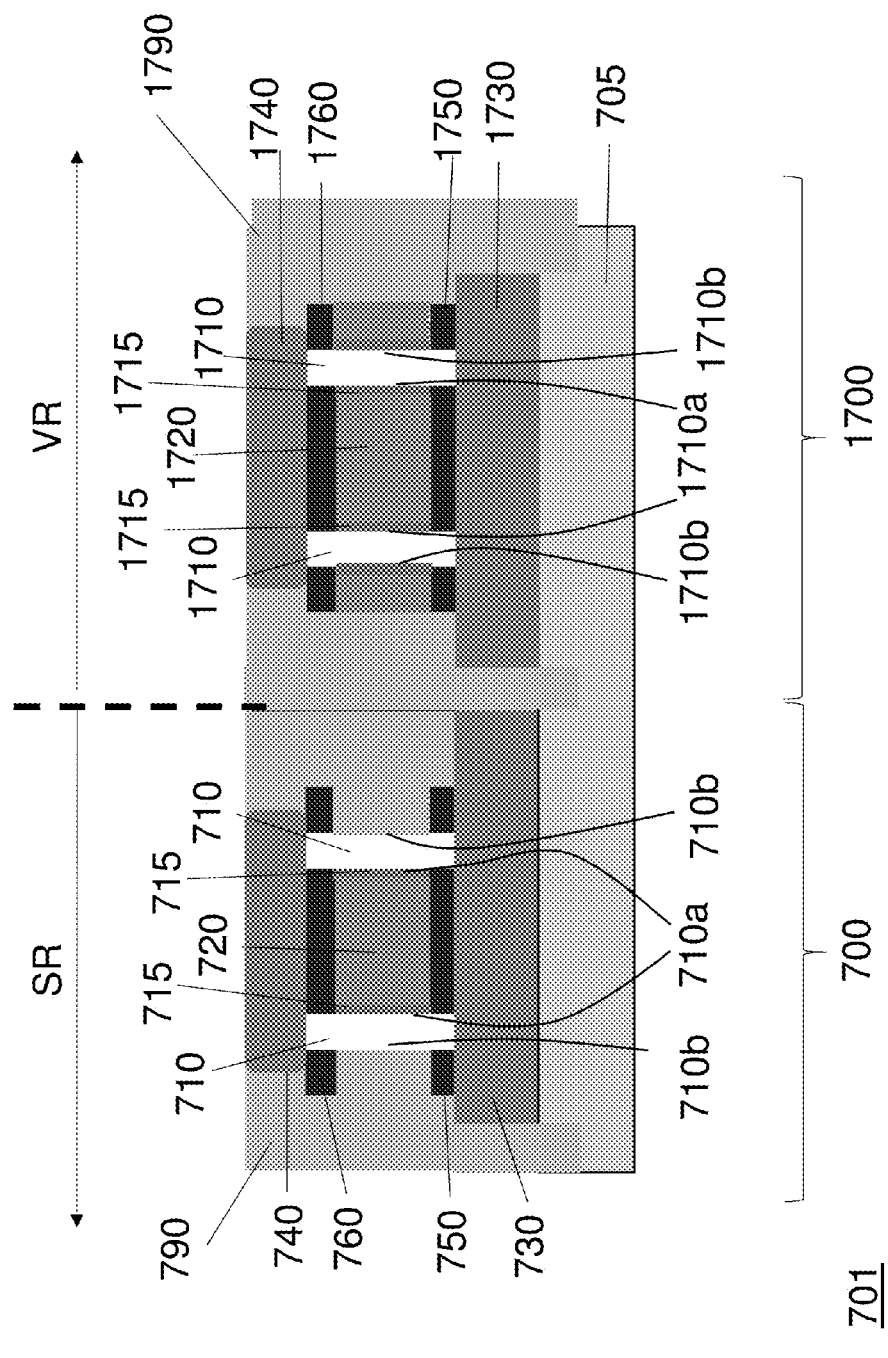
FIG. 7D illustrates the forming of a charge collector dielectric layer 790 (e.g., oxide layer) formed on the outer side 710$b$ of the pair of fin structures 710 in the VFET 700, according to an exemplary aspect of the present invention.

FIG. 7D illustrates the forming of a charge collector dielectric layer 790 (e.g., oxide layer) formed on the outer side 710b of the pair of fin structures 710 in the VFET 700, according to an exemplary aspect of the present invention. The charge collector dielectric layer 790 may be formed over the first source/drain region 730, the second source/drain region 740, and contacting the surface of the outer side 710 of the pair of fin structures 710. The charge collector dielectric layer 790 may then be planarized to have an upper surface which is co-planar with an upper surface of the second source/drain region 740.

Thus, the resulting structure of the method 700 may be radiation sensor 500 of the semiconductor device 501 which is illustrated in FIG. 5. That is, by the method 700, the VFET 700 may be transformed into the radiation sensor 500 (single-gated and sensitive to radiation) which is formed on the sensor region SR of the substrate 505 adjacent to a VFET region VR.

Thus, the method 700 may include a process flow which includes making both sensor VFETs and logic VFETs by the same flow, using a mask to cover the logic region of the substrate and open the sensor region of the substrate, removing the gate (and gate dielectric) from the outer sides of sensor FET, and filling charge collector dielectric material (e.g., oxide) on the outer side of the sensor FET.

That is, the method 700 may form radiation sensors with vertical transistors. The radiation sensor retains the basic vertical transistor structure but the gate on one side of fins is replaced with oxide which may be used collect radiation particles. When radiation particles are trapped in the oxide, the oxide serves as a back gate of the vertical transistor. The transistor characteristics such as threshold voltage (Vt) shift as a function of radiation dose, and the gate on the other side of fins may be used to sense the shift in Vt.

With its unique and novel features, the present invention provides a radiation sensor that may be formed by modifying a vertical field effect transistor (VFET).

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A radiation sensor, comprising:
  a fin structure comprising semiconductor material formed on a substrate;
  a gate formed on an inner side of the fin structure; and
  a charge collector dielectric layer formed on an outer side of the fin structure.

2. The radiation sensor of claim 1, wherein the fin structure comprises a pair of fin structures.

3. The radiation sensor of claim 1, further comprising:
  a gate dielectric formed between the gate and the inner side of the fin structure.

4. The radiation sensor of claim 1, wherein the gate comprises a metal gate and the gate dielectric comprises a high-k dielectric material.

5. The radiation sensor of claim 1, wherein the charge collector dielectric layer comprises an oxide layer.

6. The radiation sensor of claim 1, wherein the radiation sensor comprises a modified vertical field effect transistor (VFET), a threshold voltage of the modified VFET shifting as a function of radiation dose, and the gate being operable to sense the shifting of the threshold voltage.

7. The radiation sensor of claim 1, further comprising:
  a first source/drain region formed on the substrate, the fin structure being formed on the first source/drain region.

8. The radiation sensor of claim 7, further comprising:
  a second source/drain region formed on an upper surface of the fin structure.

9. The radiation sensor of claim 7, further comprising:
  a bottom spacer formed on the first source/drain region, the gate being formed on the bottom spacer.

10. The radiation sensor of claim 8, further comprising:
  a top spacer formed on the gate, the second source/drain region being formed on the top spacer.

11. A semiconductor device comprising:
  a radiation sensor, comprising:
    a fin structure comprising semiconductor material formed on a substrate;
    a gate formed on an inner side of the fin structure; and
    a charge collector dielectric layer formed on an outer side of the fin structure; and
  a vertical field effect transistor (VFET) formed on the substrate adjacent to the radiation sensor.

12. A method of forming a radiation sensor, the method comprising:
  forming a plurality of vertical field effect transistors (VFETs) on a logic region and sensor region of a substrate;
  forming a mask on the logic region, so as to expose the sensor region;
  removing a gate from an outer side of a pair of fin structures of a VFET in the sensor region; and
  forming a charge collector dielectric layer on the outer side of the pair of fin structures.

13. The method of claim 12, further comprising:
  modifying the plurality of VFETs in the sensor region to form a plurality of radiation sensors in the sensor region, the modifying of the plurality of VFETs comprising the forming of the mask, the removing of the gate and the forming of the charge collector dielectric layer.

14. The method of claim 12, further comprising:
  before the removing of the gate, etching an interlayer dielectric film of the VFET in the sensor region by using the mask.

15. The method of claim 14, wherein the etching of the interlayer dielectric film exposes a gate on the outer side of the pair of fin structures.

16. The method of claim 15, wherein the removing of the gate comprises etching the exposed gate to expose a gate dielectric.

17. The method of claim 12, wherein the forming of the plurality of VFETs comprises:
  forming a first source/drain region on the substrate;
  forming a pair of fin structures comprising semiconductor material on the first source/drain region;
  forming a gate dielectric on an inner side of the pair of fin structures, and on the outer side of the pair of fin structures;

forming the gate on the gate dielectric on the inner side of the pair of fin structures, and on the outer side of the pair of fin structures; and forming a second source/drain region on an upper surface of the pair of fin structures.

18. The method of claim 17, wherein the forming of the plurality of VFETs further comprises:

forming a bottom spacer on the first source/drain region, the gate being formed on the bottom spacer.

19. The method of claim 18, wherein the forming of the plurality of VFETs further comprises:

forming a top spacer on the gate, the second source/drain region being formed on the top spacer.

20. A radiation sensor, comprising:

a first source/drain region formed on a substrate;

a pair of fin structures comprising semiconductor material formed on the first source/drain region;

a high-k dielectric layer formed on an inner side of the pair of fin structures;

a metal gate formed on the high-k dielectric layer between the pair of fin structures;

a charge collector dielectric layer formed on an outer side of the pair of fin structures; and a second source/drain region formed on an upper surface of the pair of fin structures.

21. The radiation sensor of claim 20, further comprising:

a bottom spacer formed on the first source/drain region, the metal gate being formed on the bottom spacer.

22. The radiation sensor of claim 20, further comprising:

a top spacer formed on the gate, the second source/drain region being formed on the top spacer.

23. The radiation sensor of claim 20, wherein the charge collector dielectric layer comprises an oxide layer.

24. The radiation sensor of claim 20, wherein the radiation sensor comprises a modified vertical field effect transistor (VFET), a threshold voltage of the modified VFET shifting as a function of radiation dose, and the gate being operable to sense the shifting of the threshold voltage.

25. A method of forming a radiation sensor, the method comprising:

forming a plurality of vertical field effect transistors (VFETs) on a logic region and sensor region of a substrate, the plurality of VFETs comprising:

a pair of fin structures;

a gate dielectric formed on an inner side and an outer side of the pair of fin structures;

a gate formed on the gate dielectric; and an interlayer dielectric film formed on the gate dielectric and the gate on the outer side of the pair of fin structures;

forming a mask on the logic region, so as to expose the sensor region;

etching the interlayer dielectric film of the VFET in the sensor region by using the mask, the etching of the interlayer dielectric film exposing the gate on the outer side of the pair of fin structures of the VFET in the sensor region;

after the etching of the interlayer dielectric film, etching away the exposed gate and the gate dielectric to expose the outer side of the pair of fin structures;

forming a charge collector dielectric layer on the exposed outer side of the pair of fin structures.

* * * * *